United States Patent
Koyama (10) Patent No.: US 6,689,679 B2
(45) Date of Patent: Feb. 10, 2004

(54) SEMICONDUCTOR DEVICE HAVING BUMPS

(75) Inventor: Yugo Koyama, Ima (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/932,031

(22) Filed: Aug. 20, 2001

(65) Prior Publication Data

US 2001/0053598 A1 Dec. 20, 2001

Related U.S. Application Data

(62) Division of application No. 09/420,566, filed on Oct. 19, 1999, now Pat. No. 6,323,552.

(30) Foreign Application Priority Data

Nov. 13, 1998 (JP) .............................. 10-341110

(51) Int. Cl.[7] ...................... H01L 21/44; H01L 21/48; H01L 29/40; H01L 23/48
(52) U.S. Cl. ...................... 438/613; 438/106; 438/612; 438/617; 438/108; 257/737; 257/738; 257/784
(58) Field of Search ................... 438/612, 613, 438/617, 106, 108, 615, 614; 257/737, 738, 784

(56) References Cited

U.S. PATENT DOCUMENTS

| | | | |
|---|---|---|---|
| 3,585,461 A | | 6/1971 | Eynon et al. |
| 5,172,851 A | * | 12/1992 | Matsushita et al. ..... 228/180.22 |
| 5,299,729 A | * | 4/1994 | Matsushita et al. ..... 228/180.22 |
| 5,478,973 A | * | 12/1995 | Yoon et al. .................. 174/260 |
| 5,485,949 A | * | 1/1996 | Tomura et al. .......... 228/180.5 |
| 5,508,561 A | | 4/1996 | Tago et al. |
| 5,559,054 A | * | 9/1996 | Adamjee ..................... 438/617 |
| 5,633,204 A | * | 5/1997 | Tago et al. ................. 438/614 |
| 5,650,667 A | | 7/1997 | Liou |
| 5,726,501 A | * | 3/1998 | Matsubara .................. 257/778 |
| 5,740,956 A | * | 4/1998 | Seo et al. .............. 228/180.22 |
| 5,831,441 A | * | 11/1998 | Motooka et al. ............. 324/754 |
| 5,838,160 A | * | 11/1998 | Beaman et al. ............. 324/754 |
| 5,889,326 A | * | 3/1999 | Tanaka ........................ 257/737 |
| 5,891,760 A | * | 4/1999 | Mekdhanasarn et al. ..... 438/123 |
| 5,898,226 A | * | 4/1999 | Jeong et al. ................. 257/786 |
| 5,917,231 A | | 6/1999 | Kasai |
| 5,929,521 A | | 7/1999 | Wark et al. |
| 5,940,680 A | | 8/1999 | Lee et al. |
| 5,981,371 A | | 11/1999 | Yamazaki et al. |
| 6,001,724 A | | 12/1999 | Stansbury |
| 6,011,305 A | | 1/2000 | Suzuki et al. |
| 6,017,613 A | | 1/2000 | Baum et al. |
| 6,034,428 A | * | 3/2000 | Kawahara et al. .......... 257/700 |
| 6,034,440 A | | 3/2000 | Ball |
| 6,037,786 A | | 3/2000 | Palagonia |
| 6,153,940 A | | 11/2000 | Zakel et al. |
| 6,163,463 A | * | 12/2000 | Marrs .......................... 361/773 |
| 6,193,143 B1 | * | 2/2001 | Ishikawa ..................... 228/245 |
| 6,237,422 B1 | * | 5/2001 | Sykes ........................... 73/859 |
| 6,335,568 B1 | * | 1/2002 | Yuzawa et al. ............. 257/738 |

FOREIGN PATENT DOCUMENTS

| | | |
|---|---|---|
| JP | A-57-163919 | 10/1982 |
| JP | 08-008286 | 1/1996 |
| JP | 08-181175 | 7/1996 |
| JP | 11121492 A * | 4/1999 |
| JP | 11224888 * | 8/1999 |
| JP | 11251350 * | 9/1999 |

* cited by examiner

*Primary Examiner*—Matthew Smith
*Assistant Examiner*—Chuong A Luu
(74) *Attorney, Agent, or Firm*—Oliff & Berridge, PLC (57) ABSTRACT

A method of forming a bump, including: a first step of bonding a ball-shaped tip portion of a conductive wire to an electrode by a first tool so that a portion of the tip portion, positioned around a central portion that leads to the conductive wire and avoiding an outer peripheral portion, is pressed and plastically deformed by the first tool; a second step of tearing off the conductive wire in such a manner that the tip portion remains on the electrode; and a third step of pressing at least the central portion of the tip portion by a second tool to cause plastic deformation.

12 Claims, 11 Drawing Sheets

FIG. 12

SEMICONDUCTOR DEVICE HAVING BUMPS

This is a Division of application Ser. No. 09/420,566 filed Oct. 19, 1999. The entire disclosure of the prior application(s) is hereby incorporated by reference herein in its entirety and which is now U.S. Pat. No. 6,323,552.

BACKGROUND OF THE INVENTION

1. Field of the Invention

The present invention relates to a method of forming bumps and a bonding tool for forming bumps, a semiconductor wafer, a semiconductor chip and a semiconductor device, and methods of fabrication thereof, a circuit board and an electronic instrument.

2. Description of the Related Art

Methods of forming a bump on an electrode of a semiconductor chip using wire bonding technology are well known. For example, Japanese Patent Application Laid-Open No. 57-163919 discloses a method in which a wire is bonded to an electrode by a capillary, and the wire is then torn off so that a fragment of the wire remains on the electrode to form a bump. This method is able to form a bump more rapidly than by cumulative plating.

However, a bump formed by tearing off a wire does not adequately assure a flat upper surface, and therefore while no problems occur when using face-down bonding of a semiconductor chip on a substrate, when bonding a lead to a bump there is a problem of inferior junction accuracy. That is to say, since an upper surface of the bump is jagged or has very little surface area that is flat, the bonding area with the lead is insufficient, and the lead tends to slip off the bump.

SUMMARY OF THE INVENTION

The present invention solves this problem, and has as its objective the provision of a method of forming a bump and a bonding tool for forming a bump, a semiconductor wafer, a semiconductor chip and a semiconductor device, and methods of fabrication thereof, a circuit board and an electronic instrument such that a bump having a large bonding area can be formed easily.

(1) According to a first aspect of the present invention, there is provided a method of forming a bump, comprising: a first step of bonding a ball-shaped tip portion of a conductive wire to an electrode by a first tool so that a portion of the tip portion, positioned around a central portion that leads to the conductive wire and avoiding an outer peripheral portion, is pressed and plastically deformed by the first tool; a second step of tearing off the conductive wire in such a manner that the tip portion remains on the electrode; and a third step of pressing at least the central portion of the tip portion by a second tool to cause plastic deformation.

The ball-shaped tip portion of the conductive wire is bonded to the electrode, and a part of the tip portion is pressed and plastically deformed. The part to be pressed and plastically deformed is a portion around the central portion of the ball-shaped tip portion except the outer peripheral portion. As a result, there is a groove around the central portion of the tip portion after plastic deformation, and the outer peripheral portion remains undeformed. The conductive wire is then torn off in such a manner that the tip portion including the plastically deformed part remains on the electrode, and then at least the central portion of the tip portion is pressed and plastically deformed. As a result, the central portion of the tip portion is commonly made flat. With the bump formed in this way, since the outer peripheral portion of the ball-shaped tip portion is not deformed in the first step, the upper surface of the outer peripheral portion can also be used as a bonding area. Thus, according to the present invention, a bump having a large bonding area can be formed easily.

(2) According to a second aspect of the present invention, there is provided a method of forming a semiconductor wafer, comprising: a first step of forming an integrated circuit and a plurality of electrodes, and then bonding a ball-shaped tip portion of a conductive wire to one of the electrodes by a first tool so that a portion of the tip portion, positioned around a central portion that leads to the conductive wire and avoiding an outer peripheral portion, is pressed and plastically deformed by the first tool; a second step of tearing off the conductive wire in such a manner that the tip portion remains on the one of the electrodes; and a third step of pressing at least the central portion of the tip portion by a second tool to cause plastic deformation.

The ball-shaped tip portion of the conductive wire is bonded to the electrode, and a part of the tip portion is pressed and plastically deformed. The part to be pressed and plastically deformed is a portion around the central portion of the ball-shaped tip portion except the outer peripheral portion. As a result, there is a groove around the central portion of the tip portion after plastic deformation, and the outer peripheral portion remains undeformed. The conductive wire is then torn off in such a manner that the tip portion including the plastically deformed part remains on the electrode, and then at least the central portion of the tip portion is pressed and plastically deformed. As a result, the central portion of the tip portion is commonly made flat. With the bump formed in this way, since the outer peripheral portion of the ball-shaped tip portion is not deformed in the first step, the upper surface of the outer peripheral portion can also be used as a bonding area. Thus, according to the present invention, a semiconductor wafer which has a bump having a large bonding area can be formed easily.

(3) In this method of forming a semiconductor wafer, the first and second steps may be repeated before the third step in such a manner that the tip portion of the conductive wire remains on each of the electrodes; and a plurality of bumps may be simultaneously formed by pressing a plurality of tip portions remaining on the electrodes simultaneously in the third step.

As described, since a plurality of bumps can be formed simultaneously, the process time can be reduced.

(4) According to a third aspect of the present invention, there is provided a method of forming a semiconductor chip, comprising: a first step of cutting a semiconductor wafer having an integrated circuit and a plurality of electrodes into pieces each having a group of electrodes from the plurality of electrodes, and then bonding a ball-shaped tip portion of a conductive wire to one electrode in the group of electrodes by a first tool so that a portion of the tip portion, positioned around a central portion that leads to the conductive wire and avoiding an outer peripheral portion, is pressed and plastically deformed by the first tool; a second step of tearing off the conductive wire in such a manner that the tip portion remains on the one of the electrodes; and a third step of forming a bump by pressing at least the central portion of the tip portion by a second tool to cause plastic deformation.

The ball-shaped tip portion of the conductive wire is bonded to the electrode, and a part of the tip portion is pressed and plastically deformed. The part to be pressed and plastically deformed is a portion around the central portion of the ball-shaped tip portion except the outer peripheral portion. As a result, there is a groove around the central portion of the tip portion after plastic deformation, and the outer peripheral portion remains undeformed. The conductive wire is then torn off in such a manner that the tip portion including the plastically deformed part remains on the electrode, and then at least the central portion of the tip portion is pressed and plastically deformed. As a result, the central portion of the tip portion is commonly made flat. With the bump formed in this way, since the outer peripheral portion of the ball-shaped tip portion is not deformed in the first step, the upper surface of the outer peripheral portion can also be used as a bonding area. Thus, according to the present invention, a semiconductor chip which has a bump having a large bonding area can be formed easily.

(5) In this method of forming a semiconductor chip, wherein the first and second steps may be repeated before the third step in such a manner that the tip portion of the conductive wire remains on each electrode in the group of electrodes; and a plurality of bumps may be simultaneously formed on the group of electrodes by pressing a plurality of tip portions remaining on the group of electrodes simultaneously in the third step.

Since a plurality of bumps can be formed simultaneously, the process time can be reduced.

(6) According to a fourth aspect of the present invention, there is provided a method of forming a semiconductor device comprising: a first step of bonding a ball-shaped tip portion of a conductive wire to one of a plurality of electrodes of a semiconductor chip by a first tool so that a portion of the tip portion, positioned around a central portion that leads to the conductive wire and avoiding an outer peripheral portion, is pressed and plastically deformed by the first tool; a second step of tearing off the conductive wire in such a manner that the tip portion remains on the one of the electrodes; a third step of forming a bump by pressing at least the central portion of the tip portion by a second tool to cause plastic deformation; and a fourth step of bonding the bump to a lead.

The ball-shaped tip portion of the conductive wire is bonded to the electrode, and a part of the tip portion is pressed and plastically deformed. The part to be pressed and plastically deformed is a portion around the central portion of the ball-shaped tip portion except the outer peripheral portion. As a result, there is a groove around the central portion of the tip portion after plastic deformation, and the outer peripheral portion remains undeformed. The conductive wire is then torn off in such a manner that the tip portion including the plastically deformed part remains on the electrode, and then at least the central portion of the tip portion is pressed and plastically deformed. As a result, the central portion of the tip portion is commonly made flat. With the bump formed in this way, since the outer peripheral portion of the ball-shaped tip portion is not deformed in the first step, the upper surface of the outer peripheral portion can also be used as a bonding area. In this manner, a bump having a large bonding area can be formed easily. Then by bonding a lead to this bump, a semiconductor device can be obtained.

(7) In this method of forming a semiconductor device, wherein the first and second steps may be repeated before the third step in such a manner that the tip portion of the conductive wire remains on each of the electrodes; and a plurality of bumps may be simultaneously formed on the electrodes by pressing a plurality of tip portions remaining on the electrodes simultaneously in the third step.

As described, since a plurality of bumps can be formed simultaneously, the process time can be reduced.

(8) In this method of forming a semiconductor device, the lead may protrude into an opening formed in a substrate; and the bump may be disposed within the opening such that the lead is bonded to the bump within the opening in the fourth step.

(9) In this method of forming a semiconductor device, the lead may be formed on a substrate; and the bump may be arranged to face the lead on the substrate for the face-down bonding of No the semiconductor chip in the fourth step.

(10) In this method of forming a semiconductor device, the bump may be bonded to the lead by means of an anisotropic conductive material formed of conductive particles dispersed within an adhesive in the fourth step.

(11) According to a fifth aspect of the present invention, there is provided a bonding tool for forming a bump, wherein an aperture for passing a conductive wire which has a ball shaped tip portion is formed; wherein a pressing portion is provided around the aperture for pressing the tip portion of the conductive wire; and wherein the pressing portion has a shape that enables pressure to be applied to the tip portion avoiding an outer peripheral portion of the tip portion.

The ball-shaped tip portion of the conductive wire is passed through the aperture, and a part of the tip portion is pressed by the pressing portion. The part to be pressed is a portion around the central portion of the ball-shaped tip portion except the outer peripheral portion. Therefore, plastic deformation can be performed avoiding the outer peripheral portion of the tip portion. The conductive wire is then torn off in such a manner that the tip portion including the plastically deformed part remains on the electrode, and then at least the central portion of the tip portion is pressed and plastically deformed. By pressing the central portion of the tip portion, a bump in which an upper surface of the outer peripheral portion can also be used as a bonding area is formed. Thus, according to the present invention, a bump having a large bonding area can be formed easily.

(12) According to a sixth aspect of the present invention, there is provided a semiconductor wafer comprising an integrated circuit, a plurality of electrodes, and a bump formed on each of the electrodes, wherein a groove is formed between a central portion and an outer peripheral portion on a top surface of the bump, the heights of the central portion and the outer peripheral portion being substantially equal.

Since the outer peripheral portion that is formed outside the groove on the periphery of the central portion of the bump is at substantially the same height as the central portion, the entire upper surface of the bump forms a bonding area, and a large bonding area is available.

(13) According to a seventh aspect of the present invention, there is provided a semiconductor chip comprising an integrated circuit, a plurality of electrodes, and a bump formed on each of the electrodes, wherein a groove is formed between a central portion and an outer peripheral portion on a top surface of the bump, the heights of the central portion and the outer peripheral portion being substantially equal.

Since the outer peripheral portion that is formed outside the groove on the periphery of the central portion of the bump is at substantially the same height as the central portion, the entire upper surface of the bump forms a bonding area, and a large bonding area is available.

(14) According to an eighth aspect of the present invention, there is provided a semiconductor device, comprising: a semiconductor chip having a plurality of electrodes; a bump formed on each of the electrodes, in which a groove is formed between a central portion and an outer peripheral portion on a top surface, the heights of the central portion and the outer peripheral portion being substantially equal; a lead bonded to the bump; and a substrate on which the lead is formed.

Since the outer peripheral portion that is formed outside the groove on the periphery of the central portion of the bump is at substantially the same height as the central portion, the entire upper surface of the bump forms a bonding area, and a large bonding area is available, as a result of which a good connection with the lead is possible.

(15) In this semiconductor device, the substrate may have an opening; the lead may protrude into the opening in the substrate; and the bump may be bonded to the lead within the opening.

(16) In this semiconductor device, the lead may be formed on the substrate; and the bump may be arranged to face the lead on the substrate for the face-down bonding of the semiconductor chip.

(17) In this semiconductor device, the bump may be bonded to the lead by an anisotropic conductive material formed of conductive particles dispersed within an adhesive.

(18) According to a ninth aspect of the present invention, there is provided a circuit board on which the semiconductor device as described is mounted.

(19) According to a tenth aspect of the present invention, there is provided an electronic instrument comprising the semiconductor device as described.

DETAILED DESCRIPTION OF THE PREFERRED EMBODIMENTS

The present invention is now described in terms of a number of preferred embodiments, with reference to the drawings.

First Embodiment

In this embodiment, by using a bonding tool for forming a bump according to the present invention, a bump is formed on a semiconductor chip, and thereby a semiconductor chip of the present invention is fabricated, and a semiconductor device is fabricated by using this semiconductor chip.

In the method of fabrication of a semiconductor device according to the present invention, a lead and a bump may be bonded by any method. As bonding methods may be cited, for example, tape automated bonding (TAB), a face-down bonding including flip-chip bonding, bonding using an anisotropic conductive material, and so on. For the package form of the semiconductor device of the present invention may be applied any of a ball grid array (BGA) including a tape ball grid array (T-BGA), a chip size/scale package (CSP) including a tape chip size/scale package (T-CSP), or a tape carrier package (TCP) including a chip on film (COF) and a chip on glass (COG).

FIGS. 1 to 7 illustrate a first embodiment to which the present invention is applied. In the method of fabrication of a semiconductor device of this embodiment, TAB technology is used. Then a semiconductor device to which a T-BGA package is applied is fabricated.

FIGS. 1 to 4 illustrate the steps of forming bumps on electrodes of a semiconductor chip. These steps show an embodiment of the method of forming a bump according to the present invention, an embodiment of the method of fabrication of a semiconductor chip according to the present invention, and an embodiment of a part of the method of fabrication of a semiconductor device according to the present invention.

Figure 1:
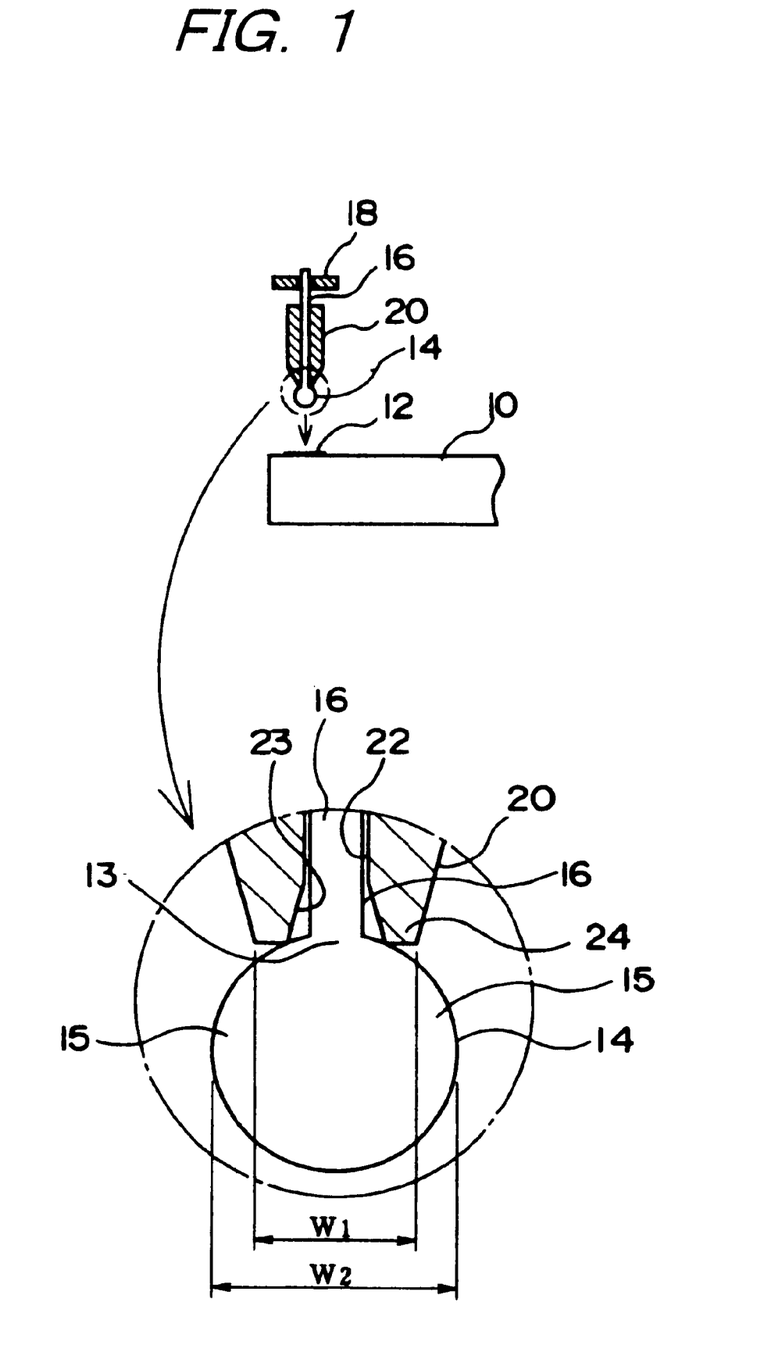
FIG. 1 illustrates a step of forming a bump in a first embodiment of the present invention.

First of all, a semiconductor chip 10 on which one or a plurality of electrodes 12 are formed is prepared, as shown in FIG. 1. Each electrode 12 is normally formed of a material such as aluminum, in a flat and thin shape on a surface of the semiconductor chip 10 on which active elements are formed. If only the electrode does not have a shape of a bump, the shape of the side surface or vertical cross section thereof are not specifically limited. The top surface of the electrode may be at the same height as the top surface of the semiconductor chip 10. There are no particular restrictions on the shape of a flat surface of the electrode 12, and they may be circular or rectangular. It should be noted that the semiconductor chip 10 can be obtained by cutting a semiconductor wafer in which are formed an integrated circuit and a plurality of electrodes 12.

A first tool (a bonding tool for forming a bump) 20 is disposed on the side of the semiconductor chip 10 on which the electrodes 12 are formed. The first tool 20 has an aperture 22 through which a conductive wire 16 is passed. The aperture 22 is of a pipe form, whereby the conductive wire 16 can be guided. The conductive wire 16 is commonly of gold, copper, or aluminum, but there are no restrictions on its composition provided that the material is electrically conductive. A tip portion 14 of the conductive wire 16 is formed into a ball shape on the outside of the end portion of the first tool 20. As long as the ball-shaped tip portion 14 forms a lump, the exact form is not significant. The tip portion 14 may be formed, for example, by a high voltage from an electric torch.

The end portion of the first tool 20 at which the aperture 22 opens functions as a pressing portion 24 for pressing the tip portion 14 of the conductive wire 16. The pressing portion 24 is a tip of the first tool 20. The aperture 22 may open in the center of the pressing portion 24. The diameter of the aperture 22 at the opening in the pressing portion 24 may be greater than the diameter of the aperture in other portions. That is to say, the aperture 22 may include a tapered aperture 23 in the pressing portion 24. The tapered aperture 23 opens wider toward a central portion 13 of the tip portion 14 that leads to the conductive wire 16. As a result, the pressing portion 24 is located above a portion around the central portion 13 of the tip portion 14. The external shape of the pressing portion 24 may be a frustum of a cone, for example. The top flat surface of this frustum of a cone is the extreme surface of the pressing portion 24. The extreme surface of the pressing portion 24 has a shape that enables pressure to be applied to the tip portion 14 avoiding an outer peripheral portion 15 of the tip portion 14 taking the central portion 13 as a datum position, to cause plastic deformation of the tip portion 14. For example, the width or diameter W1 of the extreme surface of the pressing portion 24 may be less than the width or diameter W2 of the tip portion 14 of the conductive wire 16. Alternatively, if the outer peripheral portion 15 extends outward of the pressing portion 24 by the plastic deformation, the width or diameter W1 of the extreme surface of the pressing portion 24 may be equal to or exceeding the width or diameter W2 of the tip portion 14 of the conductive wire 16.

The first tool 20 is positioned above one electrode 12 so that the tip portion 14 is positioned above that one electrode 12. A damper 18 opens, the first tool 20 is lowered, and the tip portion 14 is pressed against the electrode 12. An agency such as ultrasonic waves, heat, or the like is applied while the tip portion is attached to the electrode 12 by the application of a constant pressure.

Figure 2:
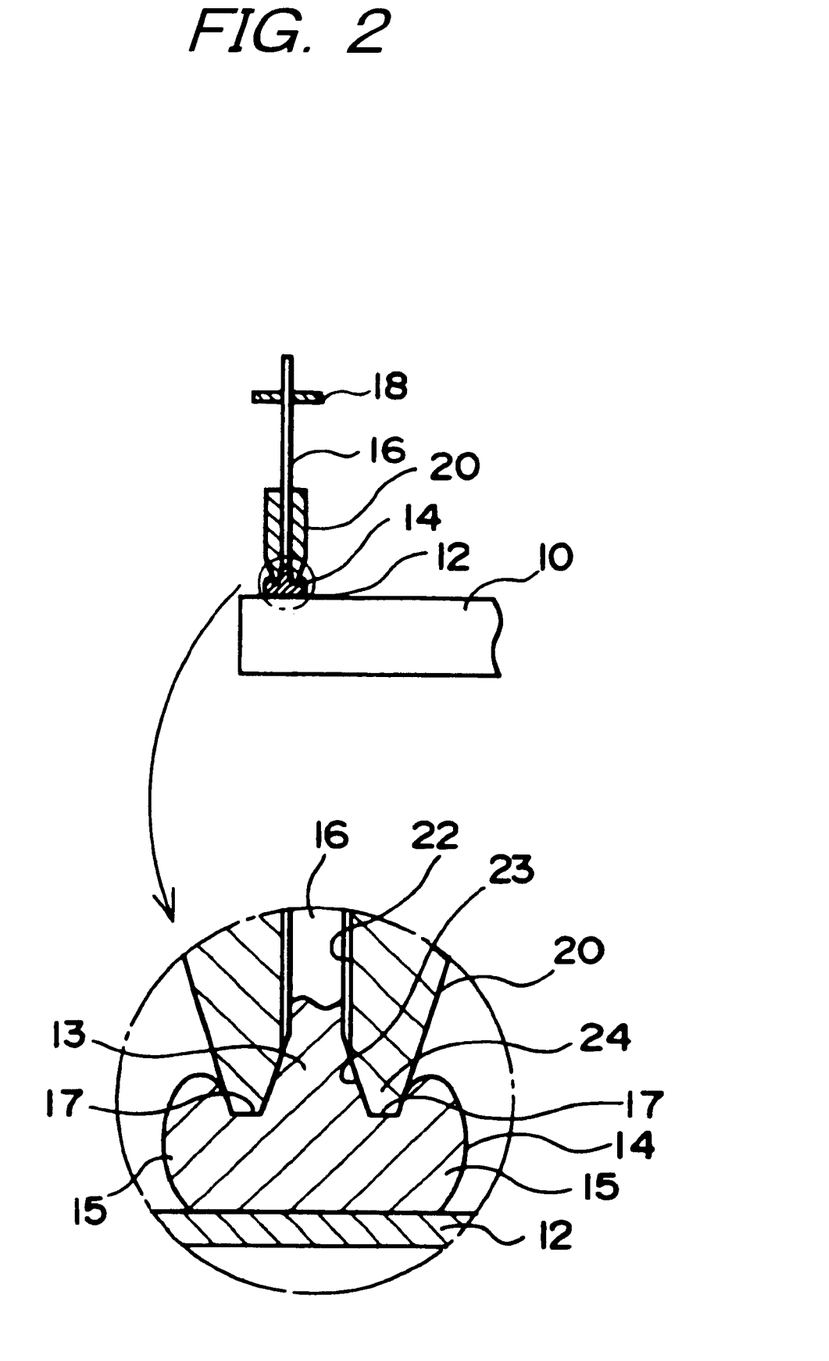
FIG. 2 illustrates a step of forming a bump in the first embodiment of the present invention.

In this way, as shown in FIG. 2, the tip portion 14 of the conductive wire 16 is bonded to the electrode 12. In the same figure, the central portion 13 of the tip portion 14 enters the aperture 23 formed in the pressing portion 24 of the first tool 20, and undergoes plastic deformation to the shape of the aperture 23. When the aperture 23 has a taper form, the central portion 13 forms a frustum of a cone. Between the central portion 13 of the tip portion 14 and the outer peripheral portion 15, a groove 17 is formed by the pressure of the pressing portion 24. When the pressing portion 24 is in the form of a frustum of a cone, the side elevation of the groove 17 close to the outer peripheral portion 15 has a taper form. The outer peripheral portion 15 of the tip portion 14 is positioned on the outside of the groove 17.

Figure 3:
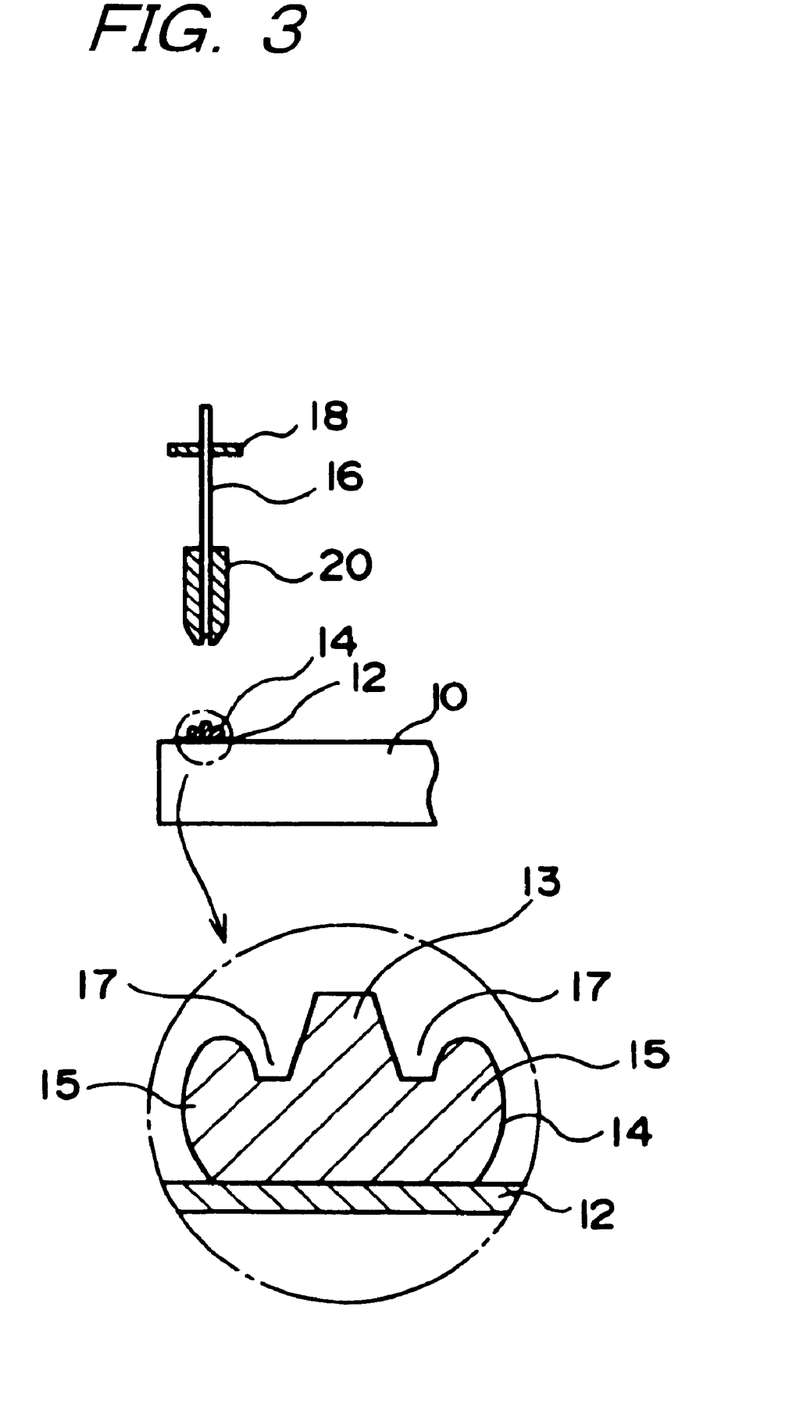
FIG. 3 illustrates a step of forming a bump in the first embodiment of the present invention.

Next, the clamper 18 is then closed, to hold the conductive wire 16, and the first tool 20 and clamper 18 are simultaneously raised as shown in FIG. 3. In this way, the conductive wire 16 is torn off, and a portion including the tip portion 14 remains on the electrode 12. When there is a plurality of electrodes 12 on which it is required that bumps be formed, the above process can be repeated for each of the plurality of electrodes 12.

Figure 4A:
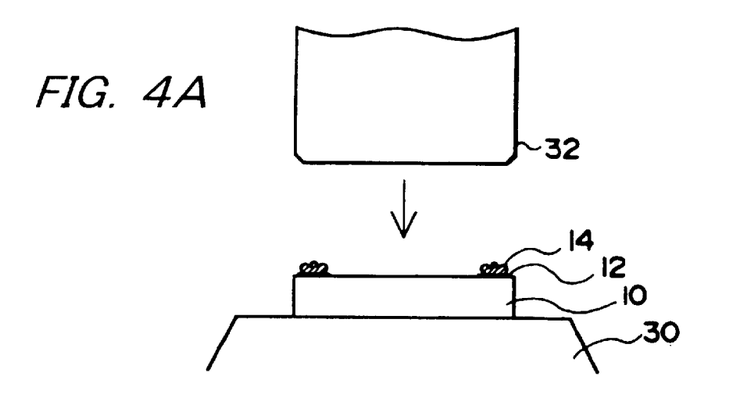
FIGS. 4A and 4B illustrate a step of forming a bump in the first embodiment of the present invention.
Figure 4B:
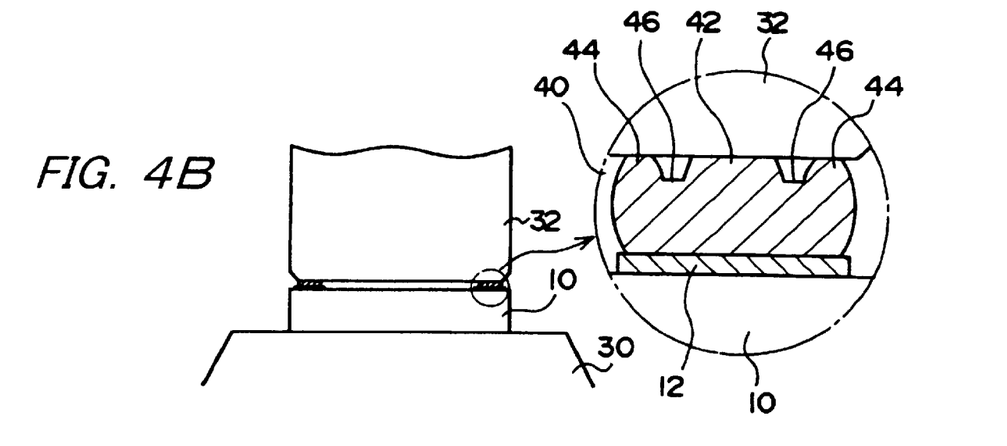

Next, as shown in FIG. 4A, the semiconductor chip 10 having a part of the conductive wire 16 (including the tip portion 14) bonded to the electrodes 12 is mounted on a stand 30, and at least the central portion 13 of the tip portion 14 is pressed by a second tool 32, as shown in FIG. 4B. The second tool 32 may have a flat surface. In this case, the flat surface applies pressure to at least the central portion 13 of the tip portion 14, causing plastic deformation. Pressure may also be applied to the outer peripheral portion 15 of the tip portion 14, causing plastic deformation. It should be noted that in this embodiment, the tip portions 14 of the conductive wires 16 remaining on a plurality of electrodes 12 are simultaneously pressed, but alternatively, one tip portion 14 of the conductive wire 16 may be pressed for each of the electrodes 12 in turn.

In this way, as shown in enlarged view in FIG. 4B, a bump 40 is formed on each electrode 12. The bump 40 has on its upper surface a groove 46 formed between a central portion 42 and an outer peripheral portion 44. The bump 40 is formed from a portion (including the tip-portion 14) of the conductive wire 16. Since the central portion 13 of the tip portion 14 is subjected to pressure by the second tool 32, it undergoes plastic deformation to the shape of the second tool 32. When the second tool 32 has a flat surface which applies pressure to the central portion 13 of the tip portion 14, the upper surface of the central portion 42 of the bump 40 is made flat. When the outer peripheral portion 15 of the tip portion 14 is also subjected to pressure from the flat surface of the second tool 32, the upper surface of the outer peripheral portion 44 of the bump 40 is also made flat. In particular, by the simultaneous application of pressure from the flat surface of the second tool 32 to the central portion 13 and outer peripheral portion 15 of the tip portion 14, the height of the central portion 42 and outer peripheral portion 44 of the bump 40 can be made the same.

In the bump 40, not only the upper surface of the central portion 42, but also the upper surface of the outer peripheral portion 44, forms a bonding area, as a result of which a larger bonding area can be obtained.

Figure 5A:
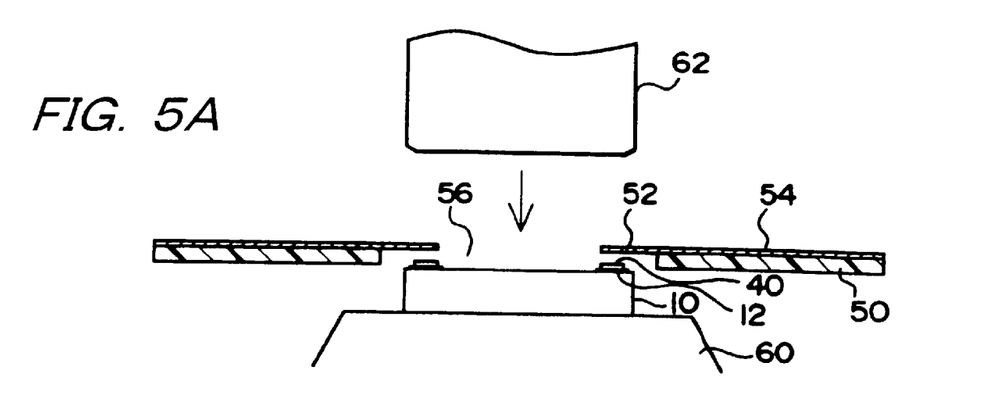
FIGS. 5A and 5B illustrate a step of bonding a lead in the first embodiment of the present invention.
Figure 5B:
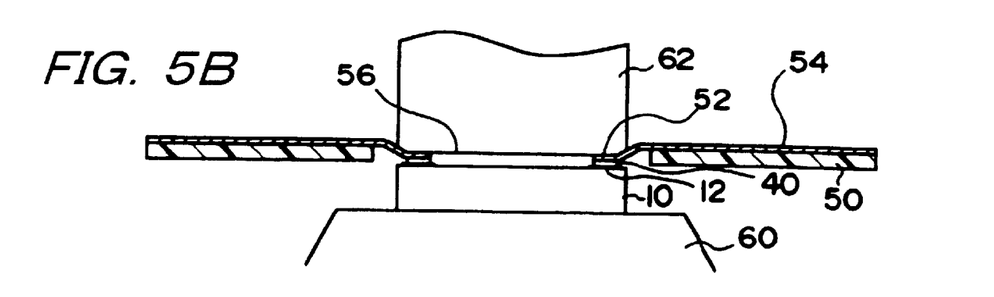

A lead 52 is then bonded to the bump 40, as shown in FIGS. 5A and 5B. That is to say, the semiconductor chip 10 is mounted on a stand 60, as shown in FIG. 5A, the lead 52 formed on a substrate 50 is disposed thereabove, and a pressing tool 62 is disposed thereabove. It should be noted that the stand 30 and second tool 32 used to press the tip portion 14 of the conductive wire 16 remaining on the electrode 12 may also be used as the stand 60 and pressing tool 62.

The substrate 50 may be formed of either an organic or inorganic material, or it could have a structure that is a composite thereof. A flexible substrate formed of polyimide resin may be cited as an example of the substrate 50 formed of an organic material. A tape used in TAB technology may be used as a flexible substrate. A ceramic or glass substrate may be cited as an example of the substrate 50 formed of an inorganic material. A glass-epoxy substrate may be cited as an example of a composite structure formed of organic and inorganic materials.

An interconnecting pattern 54 is formed on the substrate 50. The interconnecting pattern 54 is formed on one surface of the substrate 50. An opening (device hole) 56 is formed in the substrate 50, and one or more leads 52 protrude into the opening 56. Each lead 52 is electrically connected to the interconnecting pattern 54.

Such a substrate 50 has the leads 52 and interconnecting pattern 54 disposed on the opposite side thereof from the semiconductor chip 10, as shown in FIG. 5A. The substrate 50 is disposed so that the bumps 40 of the semiconductor chip 10 are positioned within the opening 56. Further, respective leads 52 formed on the substrate 50 are each positioned above a bump 40.

Each lead 52 is then bonded to the corresponding bump 40 by the pressing tool 62, as shown in FIG. 5B. In more detail, each lead 52 is bent by the pressing tool 62, and is pressed against the bump 40, then ultrasonic oscillation, heat, or the like is applied to connect the two. It should be noted that this connection causes the materials of the lead 52 and bump 40 to melt, due to the oscillation or heat. In this case, if gold is used for the bump 40 and tin is coated over the surface of the lead 52 which is made of copper, then gold-tin eutectics are formed. In this embodiment, gang-bonding in which a plurality of leads 52 are bonded simultaneously is carried out, but single-point bonding may be performed instead.

It should be noted that, if the substrate used has a structure such that leads do not protrude into an opening, the lead is pressed onto the bump with the substrate interposed.

In this embodiment, since the leads 52 are positioned on the opposite side from the semiconductor chip 10, the leads 52 are bent within the opening 56. Alternatively, if the leads 52 are bonded disposed on the same side as the semiconductor chip 10, the leads 52 need not be bent.

Figure 6:
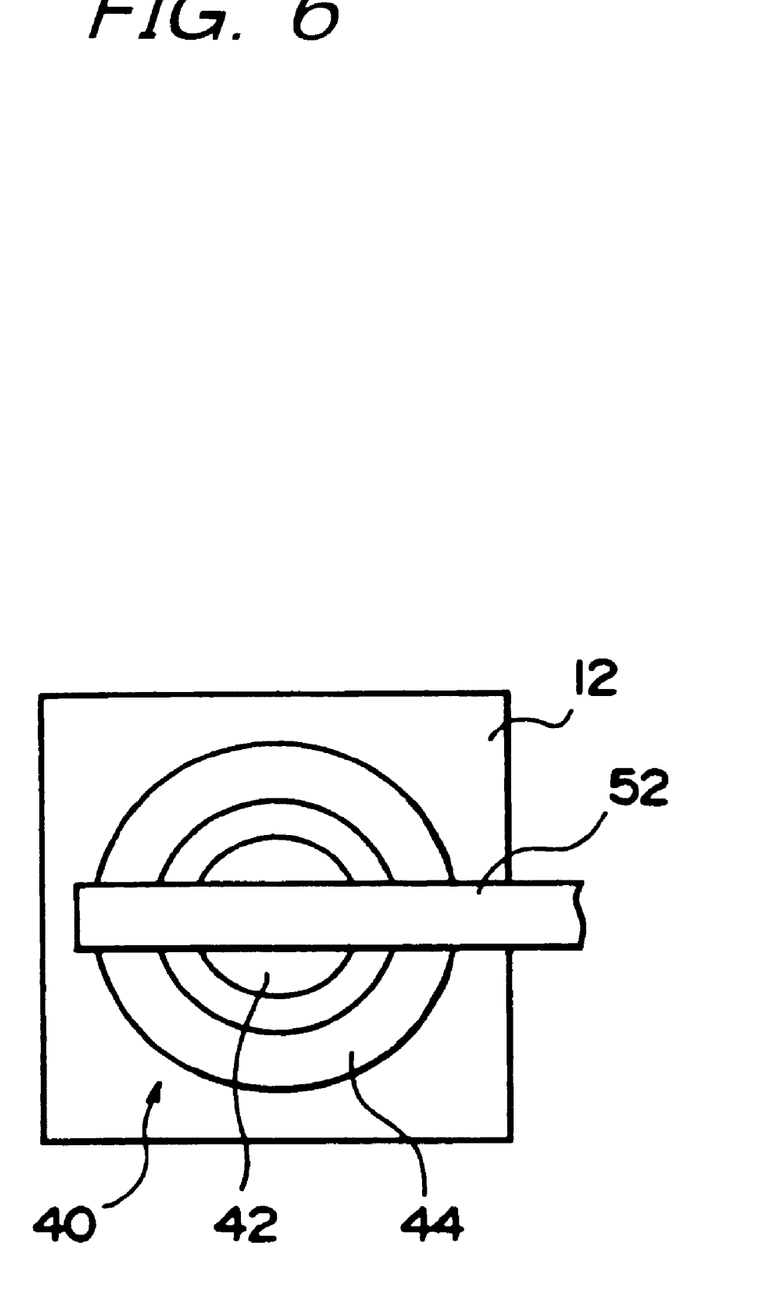
FIG. 6 shows the relation between a lead and a bump in the first embodiment of the present invention.

The lead 52 could be bonded to the corresponding bump 40 in such a manner that the tip thereof protrude beyond the bump 40, as shown in FIG. 6. Such a configuration makes it possible to guarantee a sufficiently wide contact surface area between the lead 52 and bump 40, because the lead 52 will traverse at least the upper surface of the central portion 42 and the outer peripheral portion 44 of the bump 40 even if there is some error in the positioning of the lead 52 and the bump 40.

The leads 52 of the semiconductor chip 10 can be bonded by the steps described above.

According to this embodiment, the conductive wire 16 is bonded to the electrode 12, and is torn off leaving the tip portion 14 thereof on the electrode 12, and the tip portion is then subjected to pressure making the upper surface flat whereby a bump 40 can be formed. This process can be carried out in a shorter time than the process of forming a bump by plating.

Figure 7:
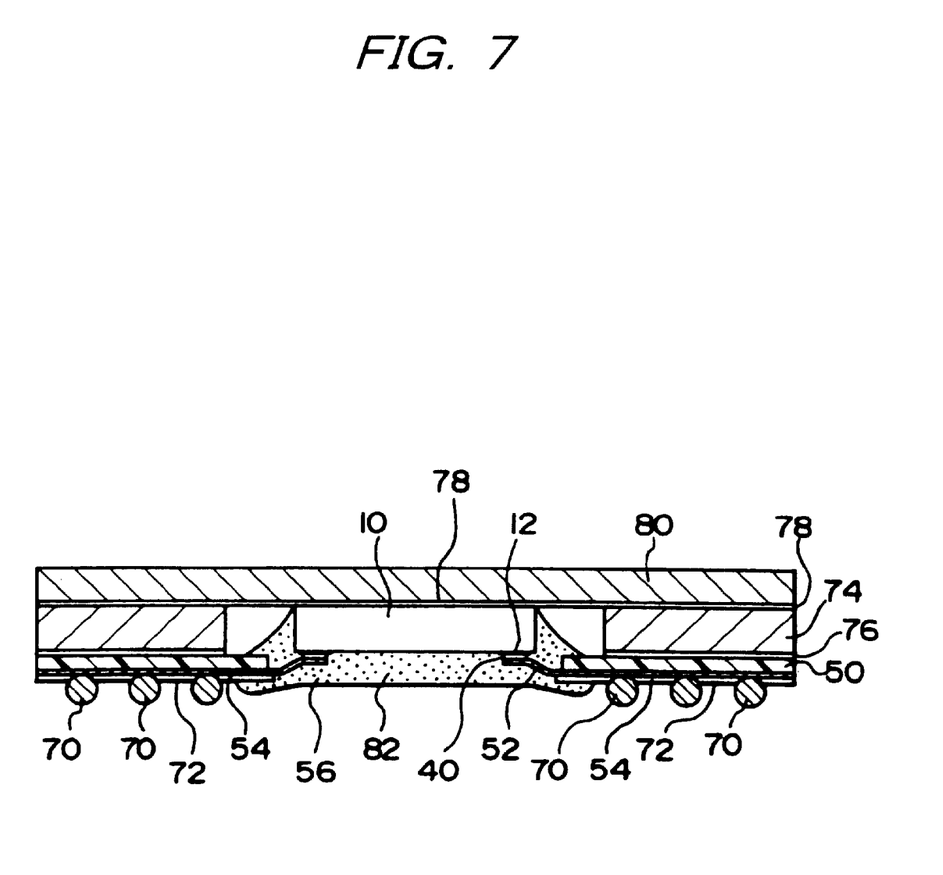
FIG. 7 shows a semiconductor device in accordance with the first embodiment of the present invention.

Next, by a conventional process, a semiconductor device as shown in FIG. 7 is obtained. The semiconductor device shown in FIG. 7 is one wherein a BGA package is utilized. That is to say, the semiconductor device shown in this figure has the substrate 50, the interconnecting pattern 54 formed on the substrate 50, a plurality of external electrodes 70 provided in the interconnecting pattern 54, and the semiconductor chip 10, and surface mounting is enabled by the pressure of the external electrodes 70.

The external electrodes 70 are solder balls, for example, that are electrically connected to the electrodes 12 of the semiconductor chip 10 by the leads 52 that are connected electrically to the interconnecting pattern 54. It should be noted that the external electrodes 70 may be formed of other than solder, for example, of copper or the like. In addition, the surface of the substrate 50 on which the interconnecting pattern 54 is formed could be coated with a solder resist 72, avoiding the external electrodes 70. The solder resist 72 covers and protects particularly the surface of the interconnecting pattern 54.

In the case that a flexible substrate is used as the substrate 50, a plate-shaped stiffener 74 is provided on the side thereof opposite to the external electrodes 70. The stiffener 74 is formed of a material such as copper, stainless steel, or a copper alloy, has the strength sufficient to maintain the flat state, and is adhered to the substrate 50 by an insulating adhesive 76. It should be noted that the insulating adhesive 76 is formed as a thermosetting or thermoplastic film. The stiffener 74 is adhered to the whole surface of the substrate 50, avoiding the semiconductor chip 10. This prevents distortion or warping of the substrate 50, improves planarity by keeping the height of the external electrodes 70 constant, and improves the mounting yield onto circuit boards.

Further, to the side of the semiconductor chip 10 opposite to the surface on which the electrodes 12 are formed, a radiator plate 80 is adhered by a thermally-conductive adhesive 78 such as a silver paste. This makes it possible to increase the radiation capability of the semiconductor chip 10. The radiator plate 80 is formed to be larger than the semiconductor chip 10, and is also adhered over the stiffener 74. It should be noted that, the space between the stiffener 74 and the radiator plate 80 is filled with the thermally-conductive adhesive 78, to make a hermetic seal. Depending on the amount of heat generated by the semiconductor chip 10, the thermally-conductive adhesive 78 could be replaced by a normal insulating adhesive or the above described insulating film.

The space between the semiconductor chip 10 and the substrate 50 is sealed by potting with a resin 82 such as an epoxy resin. The resin 82 also enters the opening 56 and surrounds the periphery of the semiconductor chip 10.

Second Embodiment

Figure 8:
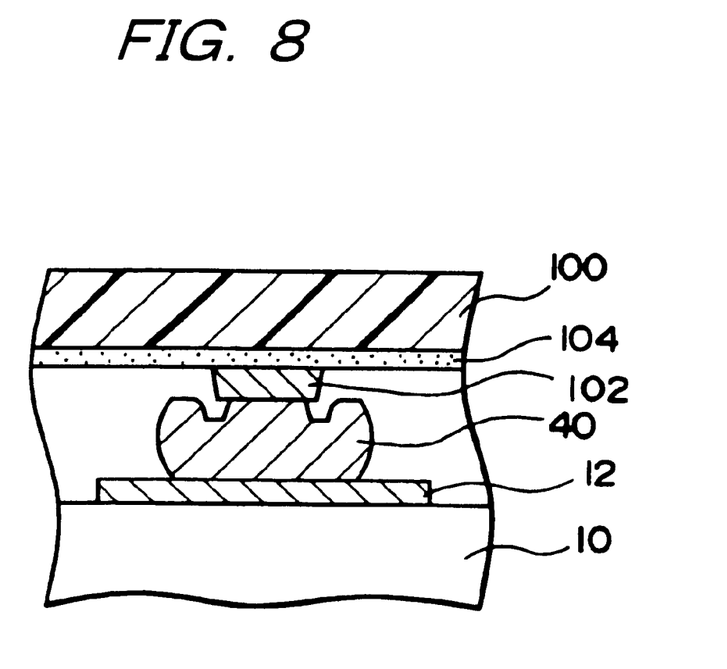
FIG. 8 shows a semiconductor device in accordance with a second embodiment of the present invention.

FIG. 8 shows a semiconductor device in accordance with a second embodiment of the present invention. In this embodiment also, a semiconductor chip 10 on which electrodes 12 are formed is used, and bumps 40 are formed on the electrodes 12. The structure and method of formation of the bumps 40 are as described in the first embodiment.

A lead 102 is formed on a substrate 100. The material of the substrate 100 may be selected from those which may be used for the substrate 50 in the first embodiment. As the substrate 100 may be used a three-layer substrate having the lead 102 adhered with an adhesive 104 interposed. Alternatively, the lead can be formed by making a conductive film such as of copper or the like by a method such as sputtering on the substrate, and etching this. In this case, the lead is formed directly on the substrate, forming a two-layer substrate with no intervening adhesive. Alternatively, an additive process can be used to form the lead by plating. Further alternatively, on the substrate an insulating resin and interconnecting pattern can be laminated to form a built-up multi-layer substrate, or a plurality of substrates can be laminated and used as a multi-layer substrate.

The semiconductor chip 10 is bonded by either face-down bonding or flip-chip bonding onto the substrate 100. That is to say, the bump 40 is contacted on the lead 102, and by means of a tool not shown in the drawing, heat and pressure is applied between the two. In this way, the bump 40 and lead 102 are metal-connected.

Since this embodiment includes the same bump 40 as the first embodiment, the same effect can be achieved.

Third Embodiment

Figure 9:
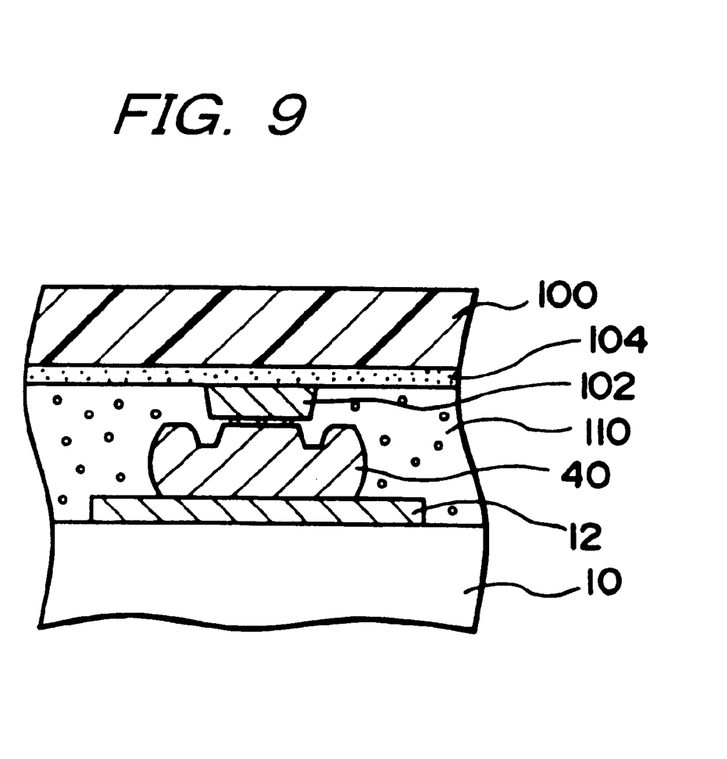
FIG. 9 shows a semiconductor device in accordance with a third embodiment of the present invention.

FIG. 9 shows a semiconductor device in accordance with a third embodiment of the present invention. In this embodiment also, a semiconductor chip 10 on which electrodes 12 are formed is used, and bumps 40 are formed on the electrodes 12. The structure and method of formation of the bumps 40 are as described in the first embodiment. The substrate 100 and lead 102 are as described in the second embodiment.

The semiconductor chip 10 is bonded by either face-down bonding or flip-chip bonding onto the substrate 100, with an anisotropic conductive material 110 interposed. The anisotropic conductive material 110 comprises conductive particles (electrically conductive filler) dispersed in an adhesive (binder), so a dispersive agent could also be added thereto. The anisotropic conductive material 110 could be formed beforehand as a sheet that is affixed to at least one of the substrate 100 and the semiconductor chip 10, or it could equally well be provided as a liquid. It should be noted that as the adhesive of the anisotropic conductive material 110 may be used a thermosetting adhesive. The anisotropic conductive material 110 is provided at least on a bonding portion of the bump 40 on the lead 102. Alternatively, if the anisotropic conductive material 110 is provided to cover the whole of the substrate 100, this step can be carried out simply.

The anisotropic conductive material 110 is pressed between the bump 40 and lead 102, and thus provides an electrical conduction therebetween by means of the conductive particles. Then the adhesive is cured to ensure the electrical conduction. If the adhesive is a thermosetting resin, curing can be effected by the application of heat.

Since this embodiment includes the same bump 40 as the first embodiment, the same effect can be achieved.

Fourth Embodiment

Figure 10:
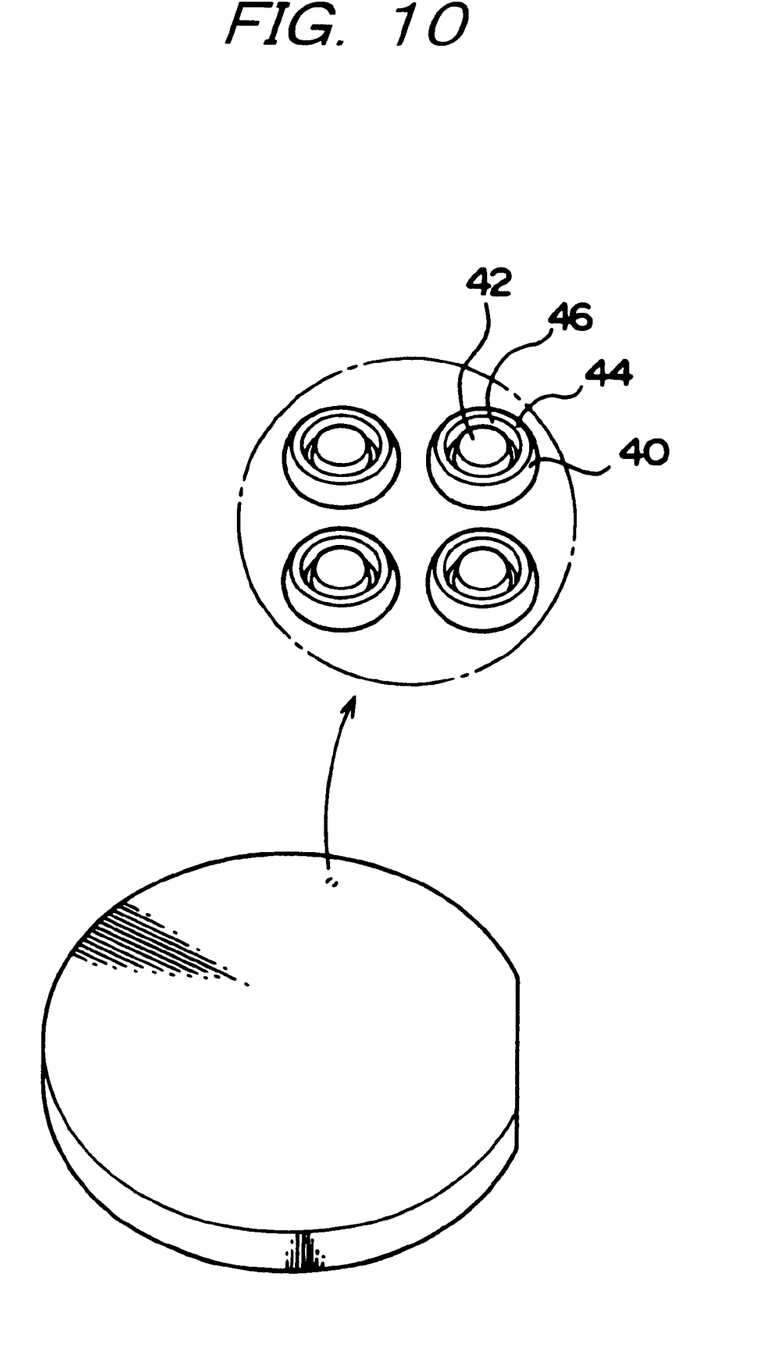
FIG. 10 shows a semiconductor wafer in accordance with a fourth embodiment of the present invention.

FIG. 10 shows a semiconductor wafer in accordance with a fourth embodiment of the present invention. The semiconductor wafer shown in this figure has an integrated circuit and a plurality of electrodes, and on each electrode is formed a bump 40. The bumps 40 are as described in the first embodiment, and their method of formation is also the same. The semiconductor wafer having the bumps 40 is cut into regions, each including a group of electrodes from the plurality of electrodes, to obtain a plurality of semiconductor chips.

Figure 11:
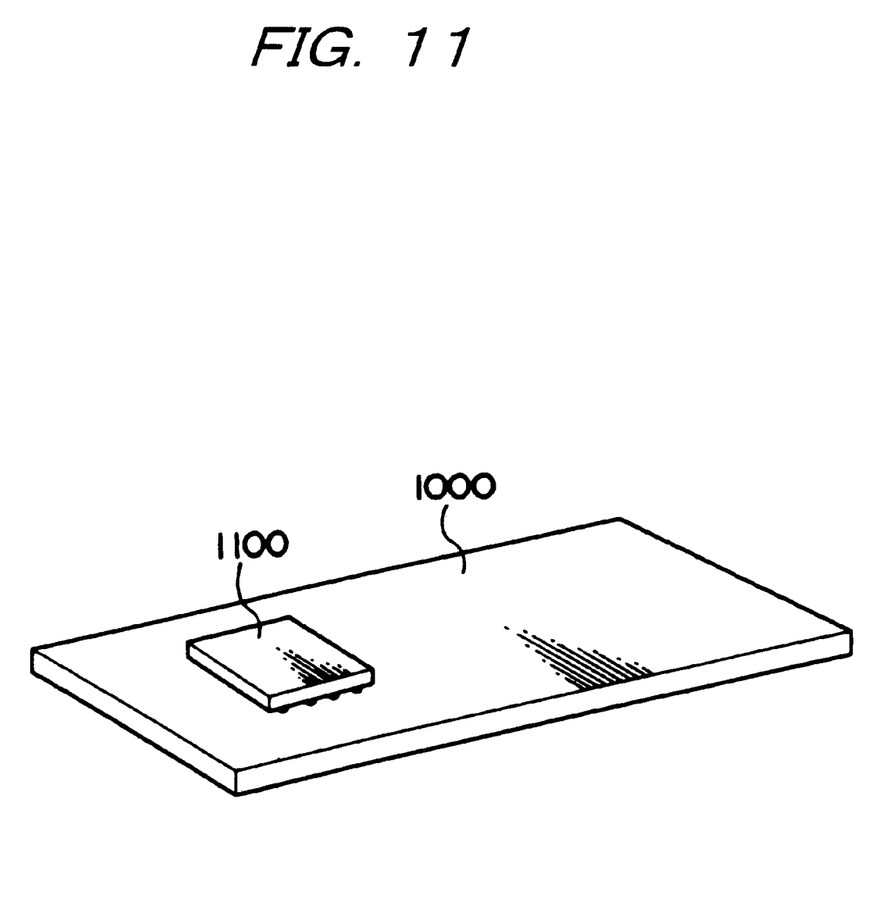
FIG. 11 shows a circuit board in accordance with an embodiment of the present invention.

In FIG. 11 is shown a circuit board 1000 on which is mounted a semiconductor device 1100 in accordance with the present invention. An organic substrate such as a glass epoxy substrate is generally used for the circuit board. On the circuit board, an interconnecting pattern of for example copper is formed to provide a desired circuit, and by mechanical connection of the interconnecting pattern to the external electrodes of the semiconductor device, electrical connection is achieved.

Figure 12:
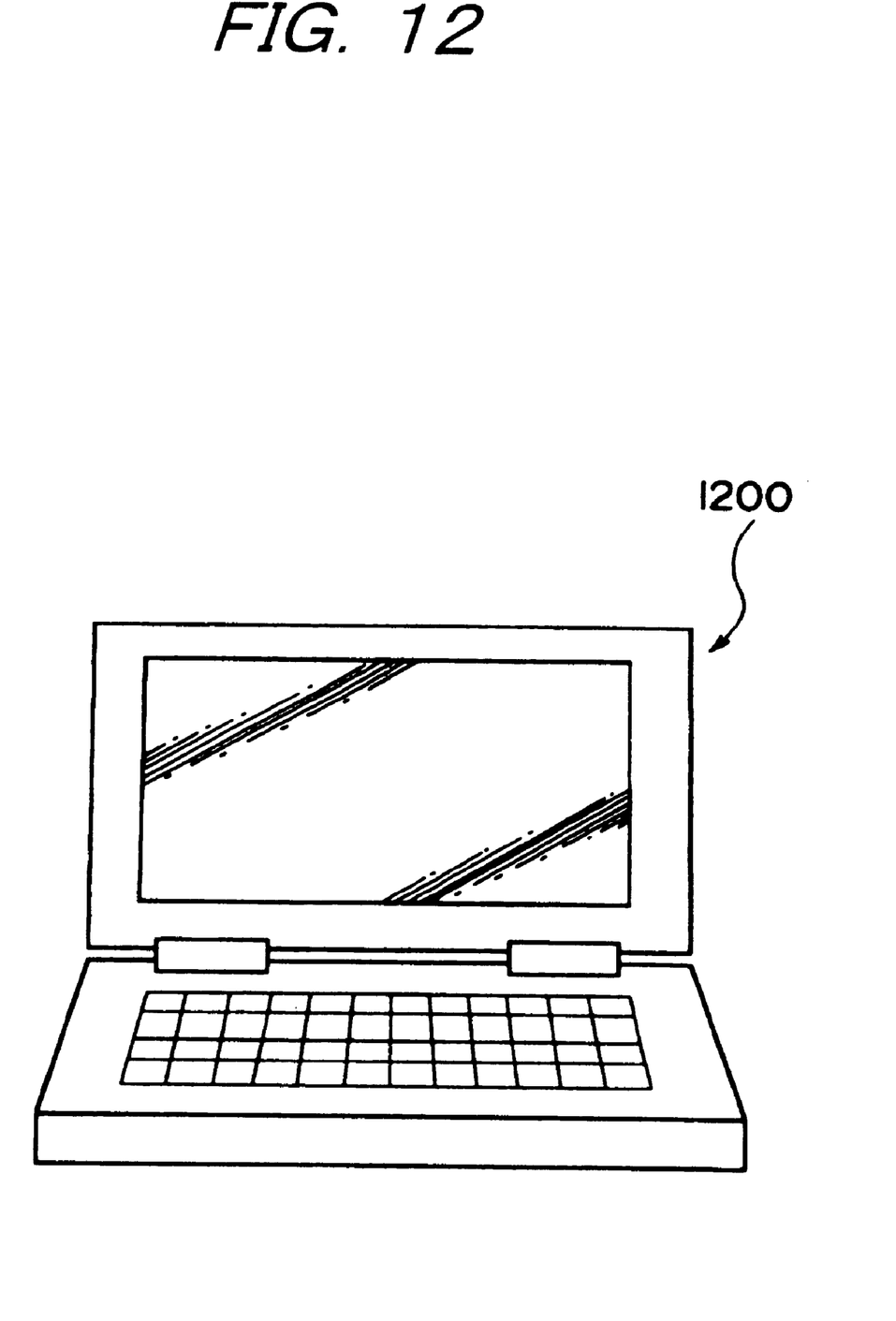
FIG. 12 shows an electronic instrument equipped with a semiconductor device fabricated by application of the method of the present invention.

As an example of an electronic instrument provided with this circuit board 1000, a notebook personal computer 1200 is shown in FIG. 12.

It should be noted that, in the above described structural elements of the present invention, "semiconductor chip" may be replaced by "electronic chip," and in the same way as for a semiconductor chip the electrodes of the electronic chip (whether an active element or a passive element) can have bumps formed. As electronic components fabricated from such electronic chips, for example, may be cited resistors, capacitors, coils, oscillators, filters, temperature sensors, thermistors, varistors, variable resistors, and fuses.

What is claimed is:

1. A method of forming a bump, comprising:

a first step of bonding a ball-shaped tip portion of a conductive wire to an electrode by a first tool so that a portion of the tip portion, positioned around a central portion that leads to the conductive wire and avoiding an outer peripheral portion, is pressed and plastically deformed by the first tool;

a second step of tearing off the conductive wire in such a manner that the tip portion remains on the electrode; and a third step of processing at least the central portion of the tip portion by a second tool to cause plastic deformation, wherein a groove is formed between the central portion and the outer peripheral portion on a top surface of the tip portion, the heights of the central portion and the outer peripheral portion being substantially equal.

2. A method of forming a semiconductor wafer, comprising:

a first step of forming an integrated circuit and a plurality of electrodes, and then bonding a ball-shaped lip portion of a conductive wire to one of the electrodes by a first tool so that a portion of the tip portion, positioned around a central portion that leads to the conductive wire and avoiding an outer peripheral portion, is processed and plastically deformed by the first tool;

a second step of tearing off the conductive wire in such a manner that the tip portion remains on the one of the electrodes; and a third step of pressing at least the central portion of the tip portion by a second tool to cause plastic deformation, wherein a groove is formed between the central portion and the outer peripheral portion on a top surface of the tip portion, the heights of the central portion and the outer peripheral portion being substantially equal.

3. The method of forming a semiconductor wafer as defined in claim 2, wherein the first and second steps are repeated before the third step in such a manner that the tip portion of the conductive wire remains on each of the electrodes; and wherein a plurality of bumps are simultaneously formed by pressing a plurality of tip portions remaining on the electrodes simultaneously in the third step.

4. A method of forming a semiconductor chip, comprising:

a first step of cutting a semiconductor wafer having an integrated circuit and a plurality of electrodes into pieces each having a group of electrodes from the plurality of electrodes, and then bonding a ball-shaped tip portion of a conductive wire to one electrode in the group of electrodes by a first tool so that a portion of the tip portion, positioned around a central portion that leads to the conductive wire and avoiding an outer peripheral portion, is processed and plastically deformed by the first tool;

a second step of tearing off the conductive wire in such a manner that the tip portion remains on the one of the electrodes; and a third step of forming a bump by pressing at least the central portion of the tip portion by a second tool to cause plastic deformation, wherein a groove is formed between a central portion and an outer peripheral portion on a top surface of the bump, the heights of the central portion and the outer peripheral portion of the bump being substantially equal.

5. The method of forming a semiconductor chip as defined in claim 1, wherein the first and second steps are repeated before the third step in such a manner that the tip portion of the conductive wire remains on each electrode in the group of electrodes; and wherein a plurality of bumps are simultaneously formed on the group of electrodes by pressing a plurality of tip portions remaining on the group of electrodes simultaneously in the third step.

6. A method of forming a semiconductor device, comprising:

a first step of bonding a ball-shaped tip portion of a conductive wire to one of a plurality of electrodes of a semiconductor chip by a first tool so that a portion of the tip portion, positioned around a central portion that leads to the conductive wire and avoiding an outer peripheral portion, is pressed and plastically deformed by the first tool;

a second step of tearing off the conductive wire in such a manner that the tip portion remains on the one of the electrodes;

a third step of forming a bump by pressing at least the central portion of the tip portion by a second tool to cause plastic deformation, wherein a groove is formed between a central portion and an outer peripheral portion on a top surface of the bump, the heights of the central portion and the outer peripheral portion of the bump being substantially equal; and a fourth step of bonding the bump to a lead.

7. The method of forming a semiconductor device as defined in claim 6, wherein the first and second steps are repeated before the third step in such a manner that the tip portion of the conductive wire remains on each of the electrodes; and wherein a plurality of bumps are simultaneously formed on the electrodes by pressing a plurality of tip portions remaining on the electrodes simultaneously in the third step.

8. The method of forming a semiconductor device as defined in claim 6, wherein the lead protrudes into an opening formed in a substrate; and wherein the bump is disposed within the opening such that the lead is bonded to the bump within the opening in the fourth step.

9. The method of forming a semiconductor device as defined in claim 7, wherein the lead protrudes into an opening formed in a substrate; and wherein the bump is disposed within the opening such that the lead is bonded to the bump within the opening in the fourth step.

10. The method of forming a semiconductor device as defined in claim 6, wherein the lead is formed on a substrate; and wherein the bump is arranged to face the lead on the substrate for the face-down bonding of the semiconductor chip in the fourth step.

11. The method of forming a semiconductor device as defined in claim 7, wherein the lead is formed on a substrate; and wherein the bump is arranged to face the lead on the substrate for the face-down bonding of the semiconductor chip in the fourth step.

12. The method of forming a semiconductor device as defined in claim 11, wherein the bump is bonded to the lead by means of an anisotropic conductive material formed of conductive particles dispersed within an adhesive in the fourth step.

* * * * *